US011835562B2

(12) United States Patent
Saito et al.

(10) Patent No.: US 11,835,562 B2
(45) Date of Patent: Dec. 5, 2023

(54) DETECTOR AND IMAGE FORMING APPARATUS

(71) Applicant: CANON KABUSHIKI KAISHA, Tokyo (JP)

(72) Inventors: Tatsuya Saito, Kanagawa (JP); Takahiro Yajima, Kanagawa (JP); Takahiro Sato, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 198 days.

(21) Appl. No.: 17/482,837

(22) Filed: Sep. 23, 2021

(65) Prior Publication Data
US 2022/0099721 A1    Mar. 31, 2022

(30) Foreign Application Priority Data

Sep. 29, 2020  (JP) ................................. 2020-163049

(51) Int. Cl.
*G01R 27/32*    (2006.01)
*G01R 29/08*    (2006.01)

(52) U.S. Cl.
CPC ................................. *G01R 29/0878* (2013.01)

(58) Field of Classification Search
CPC ............................ G01R 29/0878; G01R 27/06
See application file for complete search history.

(56) References Cited

U.S. PATENT DOCUMENTS

| | | | |
|---|---|---|---|
| 10,897,073 B2 | 1/2021 | Sato | |
| 2007/0279293 A1 | 12/2007 | Kanemura et al. | |
| 2015/0130481 A1* | 5/2015 | Debray | G01N 22/00 |
| | | | 324/637 |
| 2016/0036122 A1* | 2/2016 | Debray | H01Q 7/00 |
| | | | 216/13 |
| 2016/0181868 A1* | 6/2016 | Casse | H01Q 1/248 |
| | | | 307/104 |
| 2018/0287431 A1* | 10/2018 | Liu | H05K 1/0243 |
| 2019/0165450 A1* | 5/2019 | Ji | H01Q 5/42 |
| 2019/0259791 A1 | 8/2019 | Itsuji et al. | |
| 2020/0067170 A1* | 2/2020 | Sato | H01Q 15/14 |
| 2020/0072663 A1* | 3/2020 | Tateishi | G01N 21/3581 |
| 2020/0293806 A1 | 9/2020 | Sato et al. | |
| 2020/0296265 A1 | 9/2020 | Itsuji et al. | |
| 2020/0296266 A1 | 9/2020 | Koyama et al. | |
| 2021/0058570 A1 | 2/2021 | Sato | |

FOREIGN PATENT DOCUMENTS

| | | |
|---|---|---|
| JP | 2015-95813 A | 5/2015 |
| JP | 2018-87725 A | 6/2018 |

* cited by examiner

*Primary Examiner* — Thang X Le
(74) *Attorney, Agent, or Firm* — VENABLE LLP

(57) ABSTRACT

A detector that detects or oscillates an electromagnetic wave, the detector including a plurality of antennas having a rectifying element, wherein the plurality of arranged antennas at least include: a first antenna having a first resonant frequency; and a second antenna having a second resonant frequency that differs from the first resonant frequency.

15 Claims, 10 Drawing Sheets

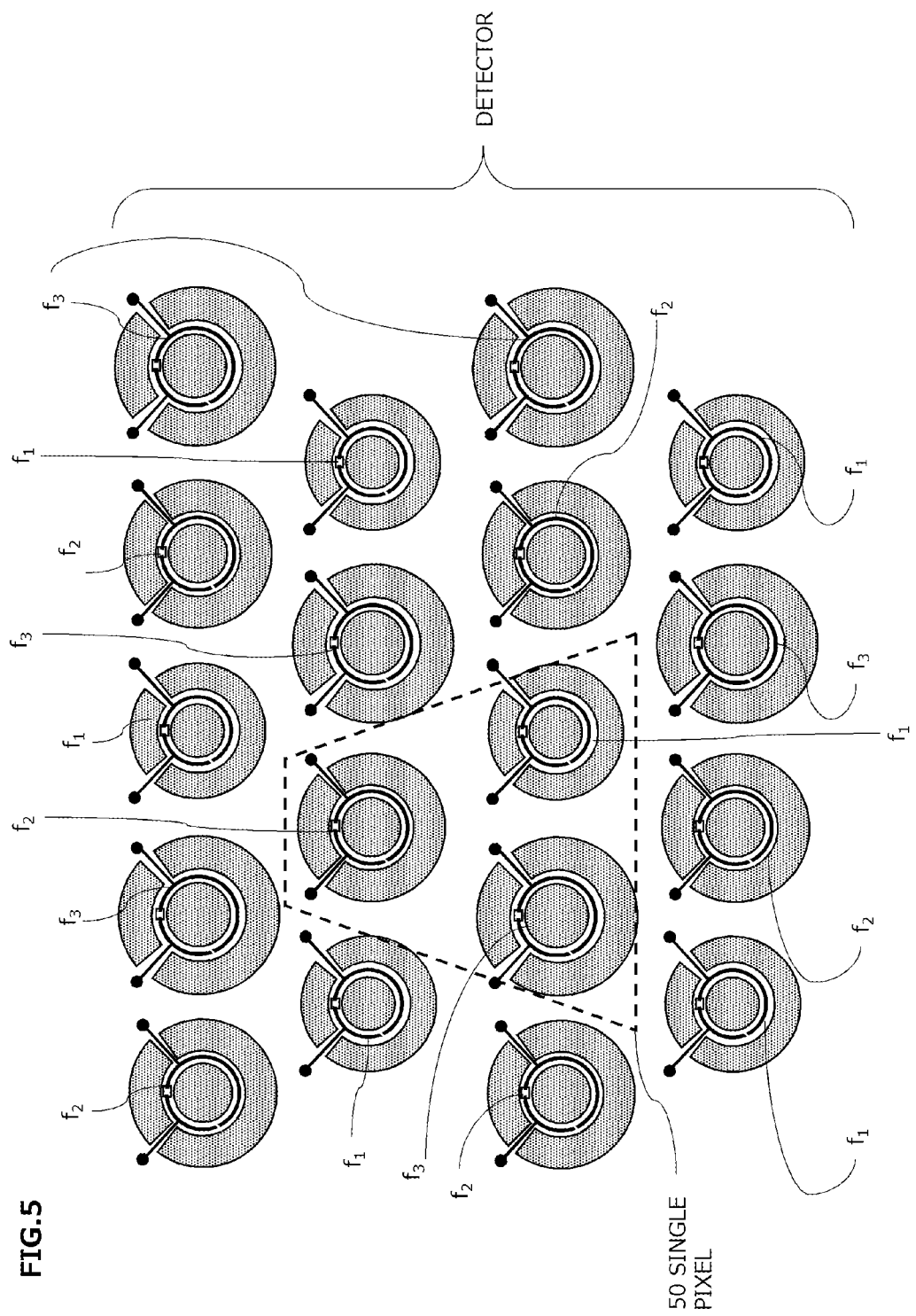

DETECTOR AND IMAGE FORMING APPARATUS

BACKGROUND OF THE INVENTION

Field of the Invention

The present invention relates to a detector and an image forming apparatus.

Description of the Related Art

An image forming apparatus that acquires an image of a measurement object can be constructed by forming a detector by arranging electromagnetic wave sensors capable of detecting electromagnetic waves of a specific wavelength and disposing a lens having a suitable focal point in front of the electromagnetic wave sensors. As an example, a detector and an image forming apparatus which utilize terahertz waves are known. A terahertz wave as used herein is an electromagnetic wave having an arbitrary frequency band that ranges from the millimeter wave region to the terahertz wave region (from 0.03 THz to 30 THz).

Examples of electromagnetic wave sensors capable of detecting terahertz waves include an electromagnetic wave sensor that utilizes a resonant antenna such as a loop antenna or a dipole antenna. In such electromagnetic wave sensors, a terahertz wave is detected by receiving the terahertz wave with a resonant antenna and detecting an electric signal in accordance with the received terahertz wave due to an action of a rectifying element connected to the resonant antenna. As the rectifying element, a Schottky barrier diode (SBD), a plasmon-type field-effect transistor, and the like are proposed.

Japanese Patent Application Laid-open No. 2018-87725 discloses a terahertz wave system having a plurality of light sources. Each light source has a plurality of oscillating elements. Japanese Patent Application Laid-open No. 2015-95813 discloses an antenna capable of receiving a plurality of frequencies with a single pixel.

Generally, with an electromagnetic wave sensor utilizing a resonant antenna, when a deviation occurs between a frequency of a received electromagnetic wave and a resonant frequency of the antenna, sensitivity declines. In a configuration in which irradiating power is secured using a plurality of oscillating elements such as in Japanese Patent Application Laid-open No. 2018-87725, since manufacturing variations make it difficult to completely match up oscillation frequencies of the individual oscillating elements, a frequency variation may occur in an electromagnetic wave irradiated from a light source.

SUMMARY OF THE INVENTION

An object of the present invention is to provide a detector capable of selecting a desired detection frequency.

An aspect of the present disclosure is a detector that detects or oscillates an electromagnetic wave, the detector including a plurality of antennas having a rectifying element, wherein the plurality of arranged antennas at least include a first antenna having a first resonant frequency and a second antenna having a second resonant frequency that differs from the first resonant frequency.

According to the present invention, a detector capable of selecting a desired detection frequency can be provided.

Further features of the present invention will become apparent from the following description of exemplary embodiments with reference to the attached drawings.

BRIEF DESCRIPTION OF THE DRAWINGS

FIG. 5 is a diagram showing an example of an array of loop antennas;

DESCRIPTION OF THE EMBODIMENTS

Figure 1A:
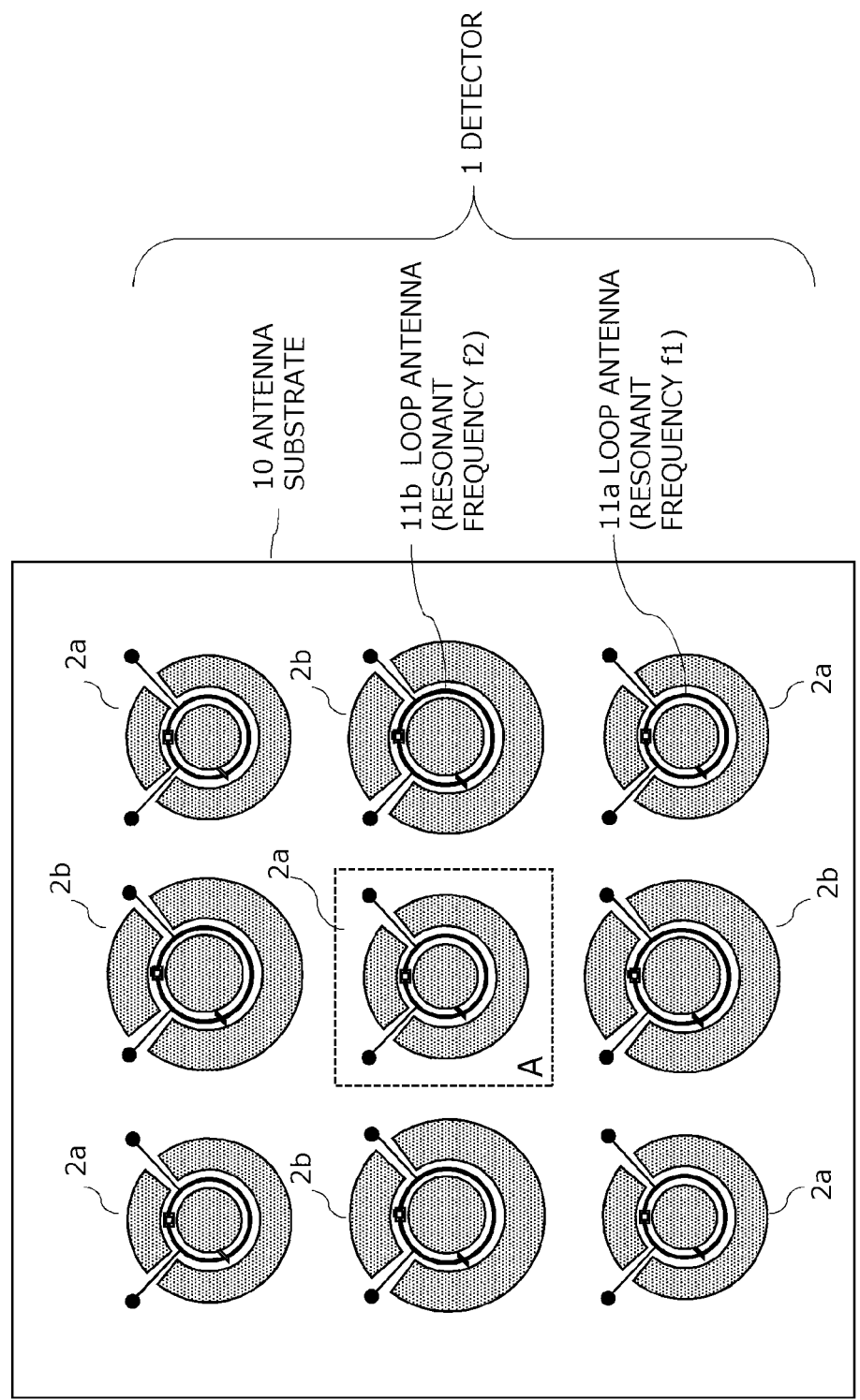
FIG. 1A is a diagram schematically showing an example of a detector according to an embodiment.

In a terahertz wave detector according to the present embodiment, a plurality of antennas having a rectifying element are arranged on an incidence surface of an electromagnetic wave, and the plurality of antennas include a first antenna having a first resonant frequency and a second antenna having a second resonant frequency. The first resonant frequency and the second resonant frequency are different frequencies, and a range from the first resonant frequency to the second resonant frequency is the same or wider than a range of frequencies to be detected. While the antennas are, for example, loop antennas, the antennas may be antennas of other types such as dipole antennas.

Hereinafter, the embodiment of the present invention will be described using a detector including a plurality of electromagnetic wave sensors utilizing a loop antenna as an example with reference to the drawings. However, the mode described below is for implementing technical concepts of the present invention and is not intended to limit the present invention. It should be noted that sizes, positional relationships, and the likes of members shown in the drawings may sometimes be exaggerated for the sake of better understanding.

Figure 1B:
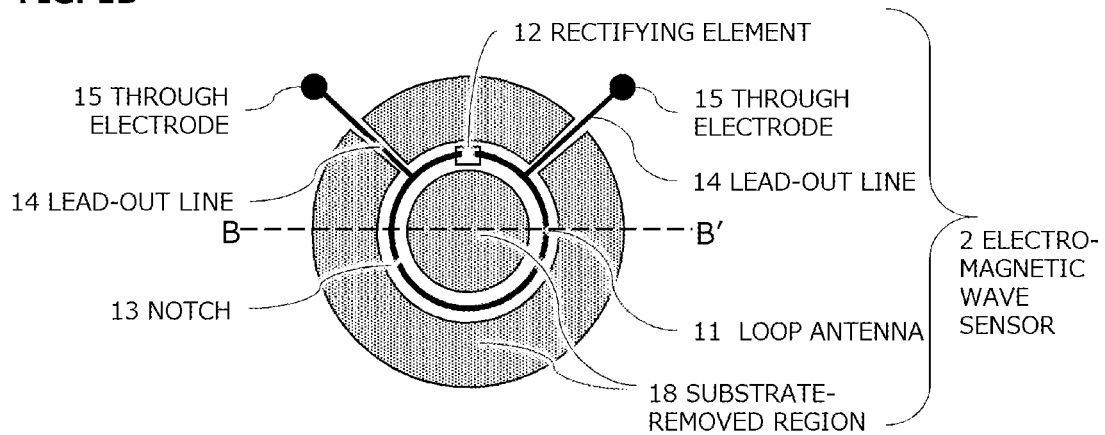
FIG. 1B is a diagram schematically showing an example of the detector according to the embodiment.
Figure 1C:
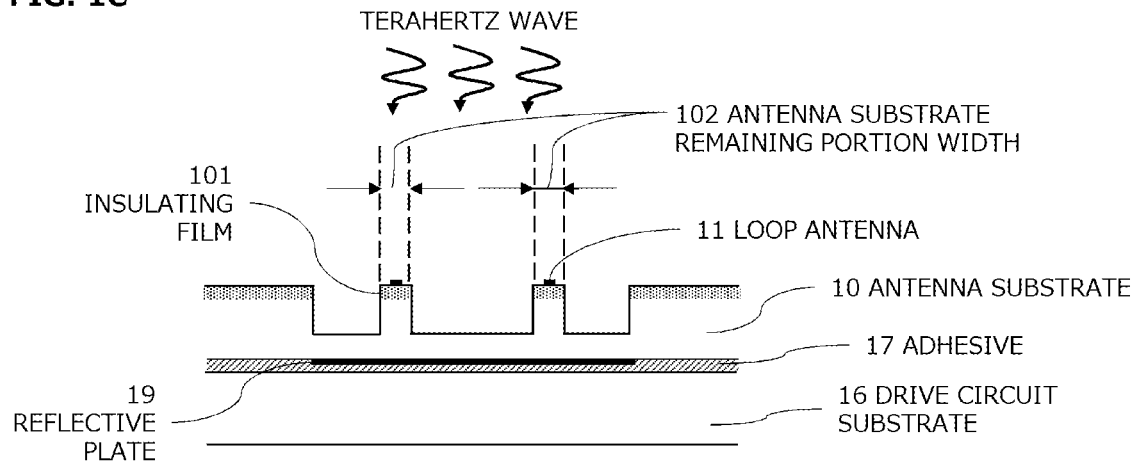
FIG. 1C is a diagram schematically showing an example of the detector according to the embodiment.

FIG. 1A is a diagram schematically showing a part of an upper surface of a detector, FIG. 1B is an enlarged view of an electromagnetic wave sensor denoted by A in FIG. 1A, and FIG. 1C is a diagram schematically showing a cross section taken along B-B' of an electromagnetic wave sensor 2. In FIG. 1A, two electromagnetic wave sensors 2a and 2b are alternately arranged in a square pattern on an antenna substrate 10 to be irradiated by a terahertz wave (an electromagnetic wave of at least 0.03 THz and not more than 30 THz). Each of the electromagnetic wave sensors 2a and 2b can also be referred to as an antenna set or a unit cell. In this case, the detector 1 may be described as a configuration in which a plurality of antenna sets are two-dimensionally arranged or the detector 1 may be described as a configuration in which a plurality of unit cells are two-dimensionally arranged. The electromagnetic wave sensors 2a and 2b respectively have loop antennas 11a and 11b, and resonant frequencies of the loop antennas 11a and 11b differ from each other. The loop antennas 11a and 11b are disposed on an insulating film 101 on the antenna substrate 10 so that the antenna substrate 10 and the loop antennas 11a and 11b do not become electrically connected to each other. While the electromagnetic wave sensor 2a and the electromagnetic wave sensor 2b differ from each other in a radius of the loop antenna and, accordingly, sizes of other members, basic structures are the same. Therefore, a description will be given with reference to FIGS. 1B and 1C without distinguishing the electromagnetic wave sensors 2a and 2b from each other by omitting the suffixes a and b.

As shown in FIGS. 1B and 1C, the electromagnetic wave sensor 2 is provided with a loop antenna 11, a rectifying element 12, a lead-out line 14, and a through electrode 15. The rectifying element 12 is connected to the loop antenna 11. In addition, the loop antenna 11 is provided with a notch 13 for driving the rectifying element 12 so that a driving voltage or current can be applied to both ends of the rectifying element 12 via the lead-out line 14. The loop antenna 11 has two terminals arranged apart from each other. A portion in which the two terminals are arranged so as to oppose each other constitutes the notch 13. The lead-out line 14 is electrically connected to a drive circuit substrate 16 via the through electrode 15. While the drive circuit substrate 16 and the antenna substrate 10 are joined by an adhesive 17, solder joining or direct bonding may be used instead. A readout circuit for reading a detected signal having been detected by the loop antenna 11 is formed on the drive circuit substrate 16. An arrangement of the respective members of the electromagnetic wave sensor 2 will be described using FIG. 1C. A surface of the drive circuit substrate 16 on a side of the adhesive 17 is assumed to be a first surface. In a cross section taken along line B-B', the drive circuit substrate 16, the adhesive 17, a reflective plate 19, the antenna substrate, the insulating film 101, and the loop antenna 11 are arranged in this order along a direction perpendicular to the first surface. In addition, an arrangement of the respective members of the electromagnetic wave sensor 2 will be described using FIG. 1B. In a direction along the line B-B', the antenna substrate 10, a substrate-removed region 18, the antenna substrate 10, the substrate-removed region 18, the antenna substrate 10, the substrate-removed region 18, and the antenna substrate 10 are arranged in this order. The loop antenna 11 is arranged on the antenna substrate 10 arranged between two substrate-removed regions 18. It should be noted that, in the present specification, the loop antenna 11 may indicate a conductor portion that constitutes a loop antenna.

In addition, when the thickness of the antenna substrate 10 increases, the number of modes in which a terahertz wave propagates increases, resulting in power loss of a terahertz wave that can be received. Therefore, the antenna substrate 10 around the loop antenna 11 is removed to partially reduce a thickness of the antenna substrate 10. A region among the antenna substrate 10 where thinning is performed and its thickness has been reduced is referred to as the substrate-removed region 18 and a portion among the antenna substrate 10 where thinning is not performed and its original thickness remains is referred to as a substrate remaining portion (or abbreviated to a remaining portion). The substrate-removed region 18 is respectively provided on an inside and an outside of the loop antenna 11 and the loop antenna 11 is disposed on the two remaining portions. In other words, the remaining portions are arranged under a conductor that constitutes the loop antenna 11.

In addition, in order to impart directionality to the loop antenna 11 to improve reception efficiency, the reflective plate 19 made of metal may be disposed between the antenna substrate 10 and the drive circuit substrate 16. It should be noted that the reflective plate 19 need not be provided.

Figure 1D:
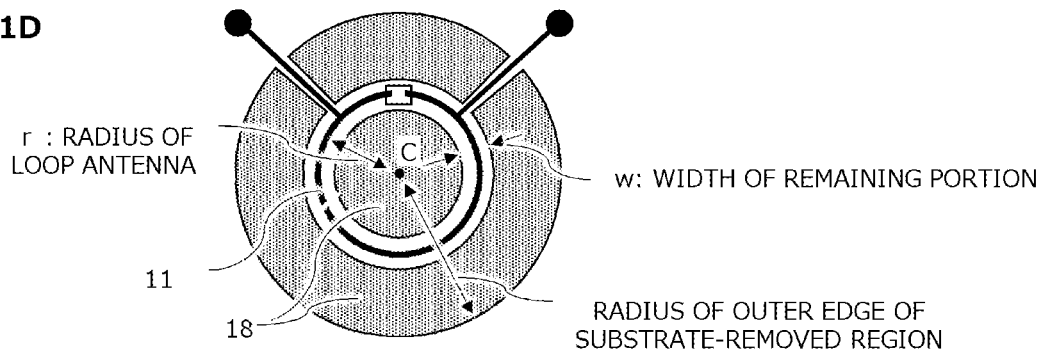
FIG. 1D is a diagram schematically showing an example of the detector according to the embodiment.

A radius of the loop antenna 11 and a width of the remaining portion will now be described with reference to FIG. 1D. The loop antenna 11 is formed by disposing the conductor in a circular shape. A radius r of the loop antenna 11 is a distance from a center C of the loop antenna 11 to a central axis of a conductor that constitutes the loop antenna 11. The remaining portion is a region between the inside substrate-removed region 18 and the outside substrate-removed region 18. In the present embodiment, an outer edge and an inner edge of the remaining portion are concentric circles centered on the center C of the loop antenna 11. A width w of the remaining portion can be defined as a difference between a radius of the outer edge of the remaining portion and a radius of the inner edge of the remaining portion. The outer edge of the outside substrate-removed region 18 is at a position that is twice the radius r of the loop antenna 11 from the center C of the loop antenna 11. Depending on a shape of the loop antenna 11, the center C may be a center of gravity. For example, a position of the center of gravity of the loop antenna can be obtained from the outer edge and the inner edge of the loop antenna.

Figure 2:
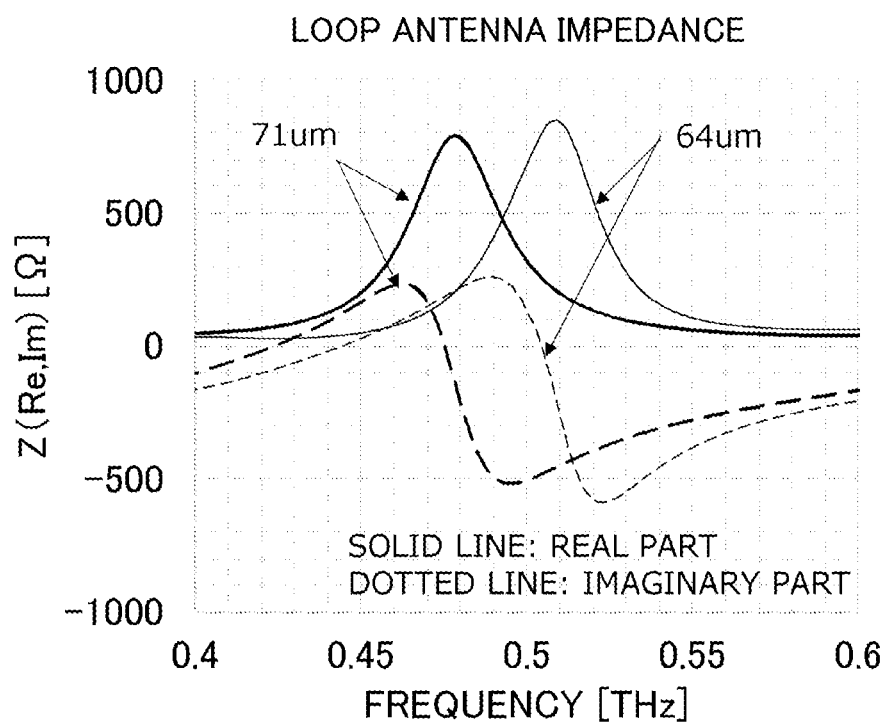
FIG. 2 represents a calculation result of a complex impedance of a loop antenna.

FIG. 2 shows a result of a calculation of a complex impedance with respect to a loop antenna such as that shown in FIGS. 1B and 1C using a known electromagnetic field simulator (Ansys HFSS). An abscissa represents a frequency (unit: THz) and an ordinate represents an impedance Z (Re, Im) (unit: Ω). Here, a case where the loop antenna has a radius of 64 μm and a case where the loop antenna has a radius of 71 μm are calculated. The antenna substrate is made of silicon and the loop antenna is made of aluminum wiring. In addition, the calculation was performed on the assumption that the substrate remaining portion width 102 is 14 μm and that 2.6 μm of silicon oxide (SiOx) is disposed between the antenna substrate and the loop antenna as the insulating film 101.

FIG. 2 confirms that an impedance real part peaks at 0.51 THz in the case of the loop antenna with a radius of 64 μm and at 0.48 THz in the case of the loop antenna with a radius of 71 μm. Since the loop antennas have a maximum sensitivity when the impedances at these frequencies match an impedance of the rectifying element, these frequencies at which the impedance real part peaks will be defined as resonant frequencies of the loop antennas. In the result shown in FIG. 2, when the impedance real part of the rectifying element connected to the loop antenna is around 800Ω, a state can be created where the impedance does not significantly deviate from the loop antennas regardless of the radius thereof.

Now, a case where the loop antenna with a radius of 71 μm is irradiated with an electromagnetic wave of a frequency other than 0.48 THz will be considered. As shown in FIG. 2, since the impedance of the loop antenna varies depending on the frequency, an impedance mismatch with the rectifying element occurs and sensitivity drops significantly at frequencies other than 0.48 THz. In a case where the loop antenna with a radius of 64 μm is irradiated with an electromagnetic wave of a frequency other than 0.51 THz, sensitivity drops significantly for similar reasons.

Figure 3:
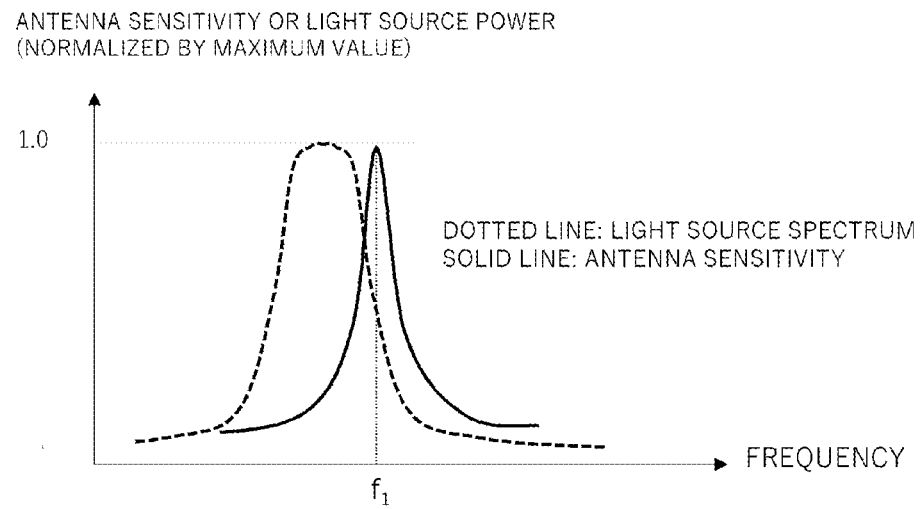
FIG. 3 is a diagram showing an example of a spectrum of an electromagnetic wave that irradiates a loop antenna.

Therefore, when the loop antenna is irradiated with an electromagnetic wave (dotted line) of which a peak of a frequency spectrum is deviated from a resonant frequency $f_1$ of the antenna as shown in FIG. 3, inclusion of an electromagnetic wave component of a frequency at which impedance does not match with the rectifying element causes sensitivity to drop. In other words, in a detector in which a plurality of loop antennas are arranged, since the sensitivity of the detector changes significantly with respect to a deviation of a frequency band of a light source when the resonant frequency of each loop antenna is the same, the detector ends up with a narrow allowable width with respect to a frequency variation of a light source. In this case, in FIG. 3, an abscissa represents a frequency and an ordinate represents a value obtained by normalizing antenna sensitivity or light source power. Among a frequency spectrum, a solid line indicates sensitivity of the antenna and a dotted line indicates a spectrum of the light source.

Figure 4A:
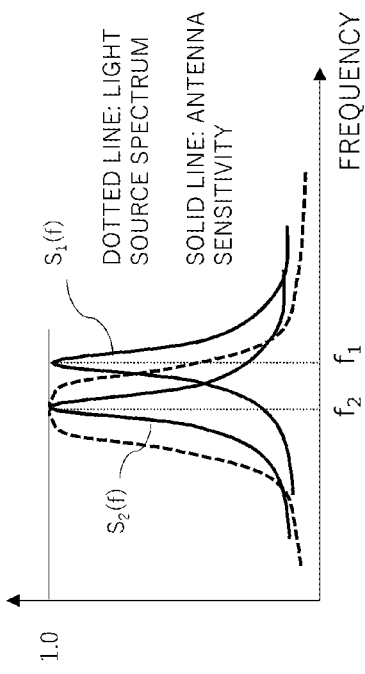
FIGS. 4A to 4D are diagrams showing an example of a pixel configuration and frequency dependence of sensitivity of the detector according to the embodiment.
Figure 4B:
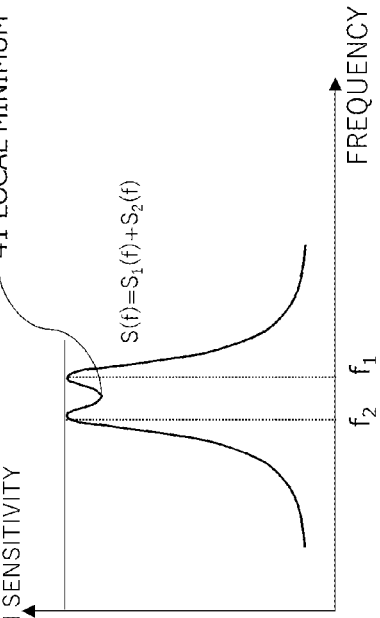

By comparison, let us consider a case where a single pixel 40 is constituted by two loop antennas 11a and 11b having different resonant frequencies $f_1$ and $f_2$ as shown in FIGS. 4A and 4B according to the present embodiment. In other words, the single pixel 40 is constituted by an antenna set made up of a single loop antenna 11a and a single loop antenna 11b. In addition, the detector according to the present embodiment outputs a signal combining signals obtained from a plurality of loop antennas included in a single pixel 40 (antenna set) as a pixel signal of the pixel.

A band of electromagnetic waves that can be detected by the loop antenna 11a is a first band including the first resonant frequency $f_1$ as indicated by $S_1(f)$ in FIG. 4B. A band of electromagnetic waves that can be detected by the loop antenna 11b is a second band including the second resonant frequency $f_2$ as indicated by $S_2(f)$ in FIG. 4B. A band in which electromagnetic waves can be detected refers to a band in which antenna sensitivity is equal to or higher than a threshold (for example, half of a maximum sensitivity). In this case, detectable bands of the loop antenna 11a and the loop antenna 11b partially overlap with each other.

In this case, the presence of two loop antennas 11a and 11b with the resonant frequencies $f_1$ and $f_2$ enables a decline in sensitivity to be more suppressed than in a case where a single pixel is constituted only by the loop antenna 11a with the resonant frequency $f_1$. This is because, even when the frequency spectrum of the light source deviates from a design value, a frequency band in which impedance does not match the rectifying element can be detected by having the two loop antennas complement each other. In this manner, according to the present embodiment, a detector with a wide allowable width with respect to a frequency variation of a light source can be provided. In other words, the detector according to the present embodiment is capable of securing a high sensitivity even when peaks of frequency spectra irradiated from a plurality of light sources vary within a range of $f_2$ to $f_1$ due to manufacturing variations.

Figure 4C:
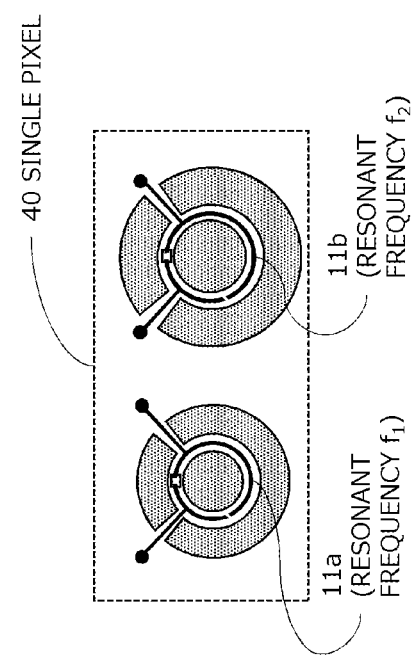
Figure 4D:
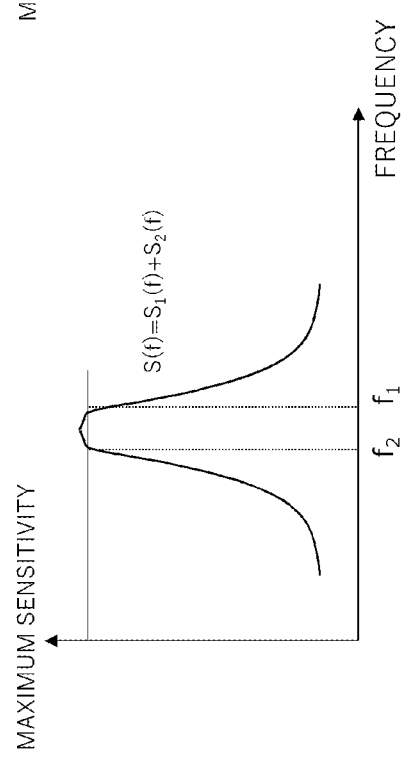

In addition, when a sensitivity obtained by adding up a sensitivity $S_1(f)$ and a sensitivity $S_2(f)$ of the loop antennas with the resonant frequencies $f_1$ and $f_2$ is denoted by $S(f)$, $S(f)$ can assume various shapes depending on shapes of $S_1(f)$ and $S_2(f)$. For example, as shown in FIG. 4C, $S(f)$ may satisfy $S(f) > S(f_1)$ and $S(f) > S(f_2)$ when $f_2 < f < f_1$. Alternatively, as shown in FIG. 4D, $S(f)$ may assume a shape having a local minimum value 41 that is smaller than $S(f_1)$ and $S(f_2)$ when $f_2 < f < f_1$. In addition, $S(f)$ may assume a shape other than those shown in FIGS. 4C and 4D.

While sensitivity peaks desirably have an approximately constant value in the frequency band of $f_2$ to $f_1$ as shown in FIG. 4C, a difference between sensitivities may be created as shown in FIG. 4D. However, in order to secure a high sensitivity within a range of $f_2$ to $f_1$ in such a case, the local minimum value 41 is preferably equal to or higher than ¾ of a maximum sensitivity. In other words, in all frequency bands within $f_2$ to $f_1$, a value of $S(f)$ is preferably equal to or higher than ¾ of the maximum sensitivity of $S(f)$ within the range.

In addition, while a single pixel is formed by an antenna set made up of two loop antennas with different resonant frequencies in FIG. 4A, alternatively, a single pixel may be formed by an antenna set made up of three or more loop antennas.

Furthermore, loop antennas may be arranged in an array other than the square array shown in FIG. 1A. For example, as shown in FIG. 5, three loop antennas with different resonant frequencies may be periodically arranged in a triangular grid pattern to form a single pixel 50 by an antenna set made up of three loop antennas.

Figure 6A:
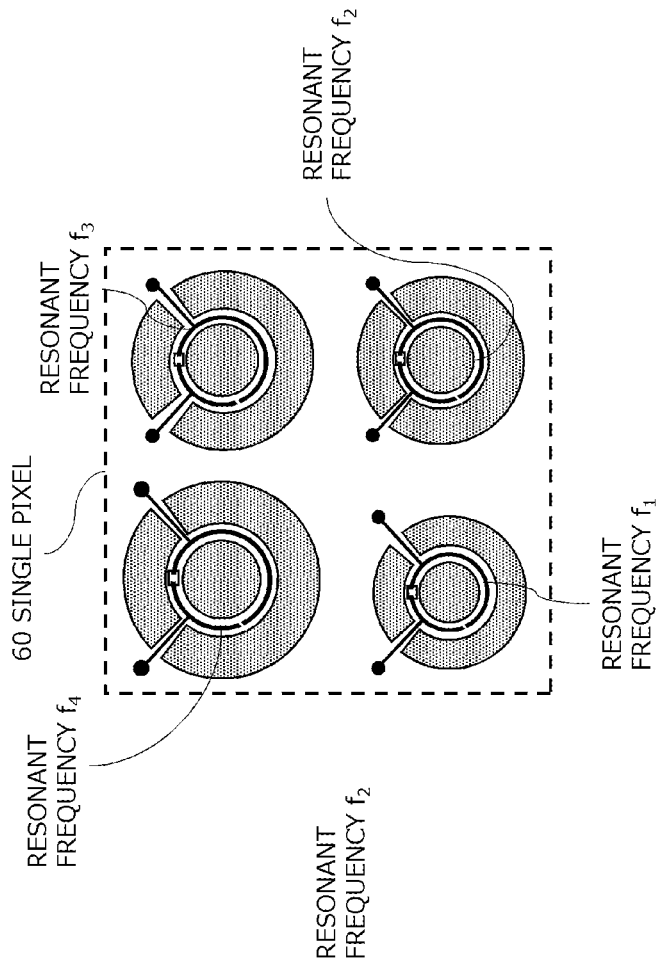
FIGS. 6A and 6B are diagrams showing a configuration example of a pixel of the detector according to the embodiment.
Figure 6B:
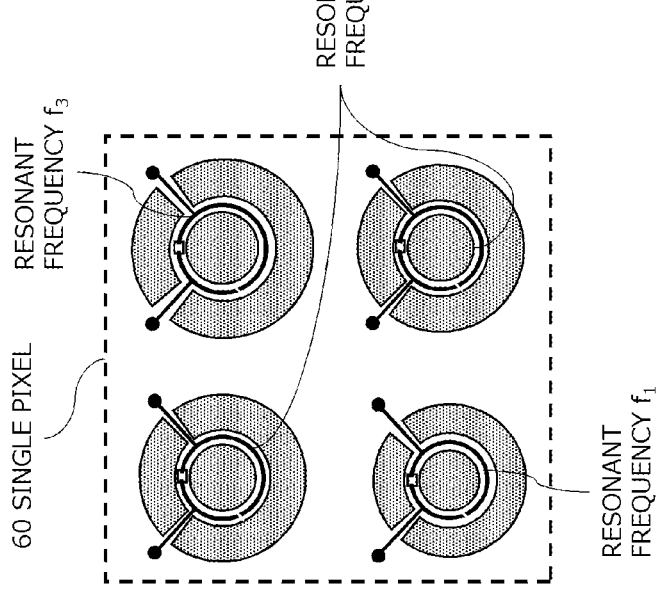

In addition, an arrangement of loop antennas with different resonant frequencies in a single pixel is also not particularly limited. For example, as shown in FIGS. 6A and 6B, four loop antennas may form a single pixel 60, and three loop antennas with different resonant frequencies may be disposed as shown in FIG. 6A or four loop antennas may be disposed as shown in FIG. 6B.

Figure 7:
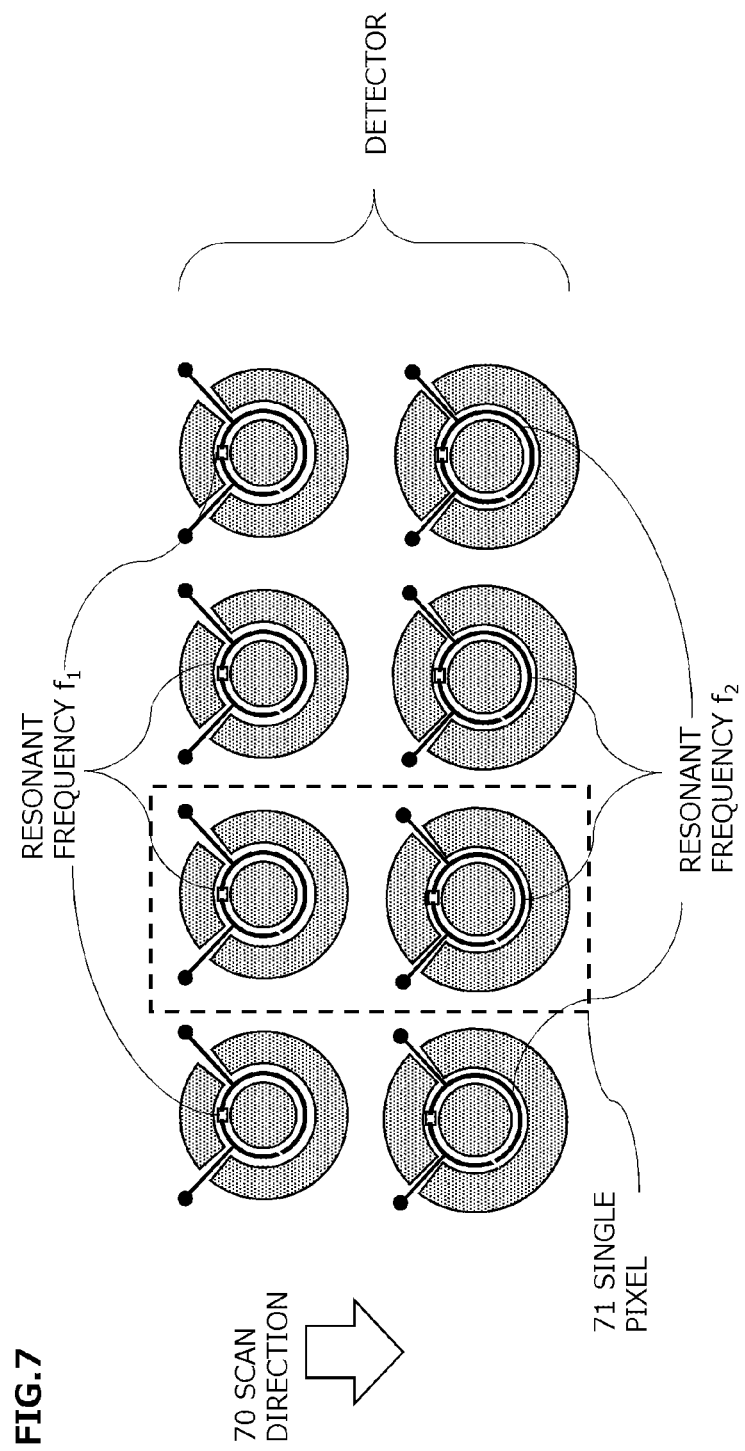
FIG. 7 is a diagram showing an example of an array of loop antennas.

Furthermore, as shown in FIG. 7, loop antennas with different resonant frequencies may be linearly arranged to form a detector. FIG. 7 shows a configuration example in which two loop antennas with different resonant frequencies are disposed in alternate rows. In this case, a single pixel 71 is constituted by two loop antennas with different resonant frequencies that are adjacent to each other in a column direction (a scan direction 70). Performing imaging by causing a subject or the detector to be scanned in the scan direction 70 enables the detector to be used as a line sensor in which loop antennas with different resonant frequencies constitute a single pixel 71.

While the plurality of antennas are provided so that intervals of centers C of the loop antennas are constant in the arrangements of the loop antennas described above, the plurality of antennas are not limited to such arrangements. In addition, in the plurality of antennas included in each pixel, the centers C of the respective loop antennas may be disposed equidistantly. Furthermore, when alternately arranging loop antennas with different sizes in each row, intervals of the center C may differ from one row to the next.

Figure 8:
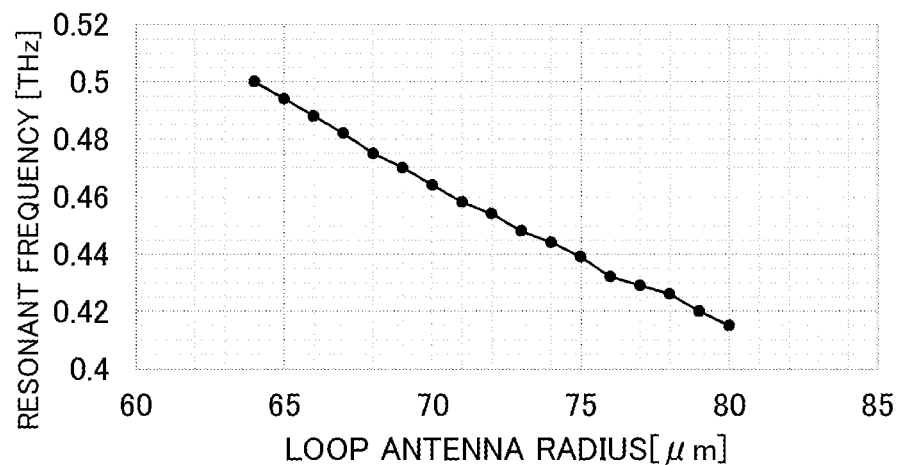
FIG. 8 represents a calculation result of a resonant frequency with respect to a radius of a loop antenna.

FIG. 8 is a graph showing a relationship between a radius and a resonant frequency of a loop antenna as calculated using the method used in FIG. 2. However, unlike the calculation shown in FIG. 2, the calculation in FIG. 8 is performed on the assumption that 1.8 μm of SiOx is disposed between the antenna substrate and the loop antenna as an insulating film.

As an example, a case will now be considered where, in a detector that receives terahertz waves irradiated from a plurality of light sources, the peaks of the frequency spectrum of each individual light source has a variation of ±0.02 THz centered on 0.45 THz. According to FIG. 8, by selecting a plurality of radii of loop antennas from a range of approximately at least 64 μm and not more than 80 μm or, more suitably, at least 69 μm and not more than 77 μm and forming a single pixel with the loop antennas, a detector that accommodates a frequency variation of the light sources can be realized.

Figure 9:
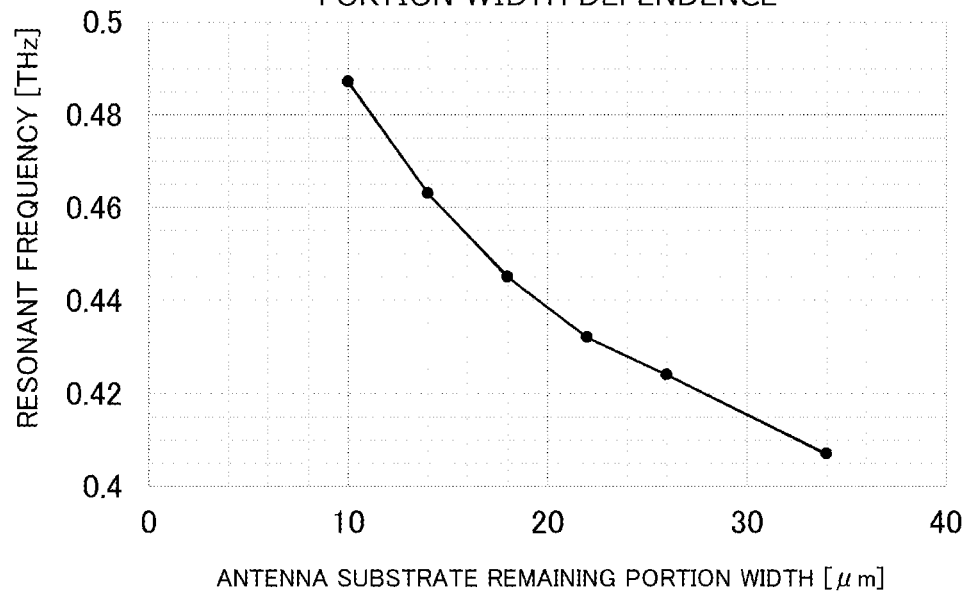
FIG. 9 represents a calculation result of a resonant frequency with respect to a width of an antenna substrate remaining portion.

Besides the radius of a loop antenna, examples of parameters that determine a resonant frequency include the antenna substrate remaining portion width 102 of the antenna substrate on which the loop antenna 11 shown in FIG. 1C is disposed. FIG. 9 is a graph showing a relationship between the antenna substrate remaining portion width 102 and a resonant frequency as calculated using the method used in FIG. 8. In this case, the radius of the loop antenna is set to 64 μm and, unlike the calculation shown in FIG. 8, the calculation is performed on the assumption that 1.5 μm of SiOx is disposed between the antenna substrate and the loop antenna as the insulating film 101.

As an example, a case will now be considered where, in a detector that receives terahertz waves irradiated from a plurality of light sources, the peak of the frequency spectrum of each individual light source has a variation of +0.02 THz centered on 0.45 THz. According to FIG. 9, by selecting a plurality of antenna substrate remaining portion widths from a range of approximately at least 10 μm and not more than 34 μm or, more suitably, at least 12 μm and not more than 23 μm and forming a single pixel with the loop antennas, a detector that accommodates a frequency variation of the light sources can be realized.

In addition, FIG. 8 confirms that when the loop antenna has a radius of 64 μm, the antenna substrate remaining portion width is 14 μm, and the insulating film between the antenna substrate and the loop antenna is 1.8 μm, the resonant frequency is 0.50 THz. On the other hand, FIG. 9 confirms that when the loop antenna has a radius of 64 μm, the antenna substrate remaining portion width is 14 μm, and the insulating film between the antenna substrate and the loop antenna is 1.5 μm, the resonant frequency is 0.46 THz. Since there is a difference between both resonant frequencies, a thickness of the insulating film between the antenna substrate and the loop antenna can also be described a parameter for changing the resonant frequency. Therefore, loop antennas with different resonant frequencies may be prepared by changing the thickness of the insulating film between the antenna substrate and the loop antenna for each loop antenna and a single pixel may be formed by the loop antennas. The thickness of the insulating film may be selected in plurality from a range of, for example, at least 1.5 μm and not more than 2.6 μm.

As described above, according to the present invention, combining parameters such as a loop antenna radius, a substrate remaining portion width, and a thickness of an insulating film between the antenna substrate and the loop antenna enables detection frequency to be changed with a high degree of freedom. Therefore, a detector with a broad detection frequency band that accommodates a frequency variation of a light source can be provided. Since a vicinity of a sensitivity peak of the detector is broad, a high sensitivity can be secured even when a frequency of the light source varies.

The detector described above can be used in a terahertz wave camera (image forming apparatus). The terahertz wave camera is configured so as to include a light source that irradiates a terahertz wave (electromagnetic wave), the detector described above, and a signal processing portion that generates an image from a signal detected by the detector.

First Example

In the present example, an example of the detector according to the present invention such as that shown in FIG. 1 in which a single pixel is formed by loop antennas with different radii will be described.

In the present example, a silicon substrate is used as the antenna substrate 10 and a Schottky barrier diode is used as the rectifying element 12. Although details will be omitted, in order to fabricate a Schottky contact on the antenna substrate 10 made of silicon, an impurity concentration of the silicon surface must be brought down to approximately $1 \times 10^{18}$ [atoms/cm$^3$] or lower. In the present example, n-type silicon having an impurity concentration of $2 \times 10^{16}$ [atoms/cm$^3$] epitaxially grown to a thickness of 200 nm on the silicon substrate with a thickness of 725 μm and having a (100) plane is used. Since characteristics of a Schottky barrier diode is determined by a work function of silicon and metal, the characteristics significantly vary depending on a type of a metallic material used as an electrode. In the present example, 50 nm-thick cobalt is used as the electrode.

Figure 10:
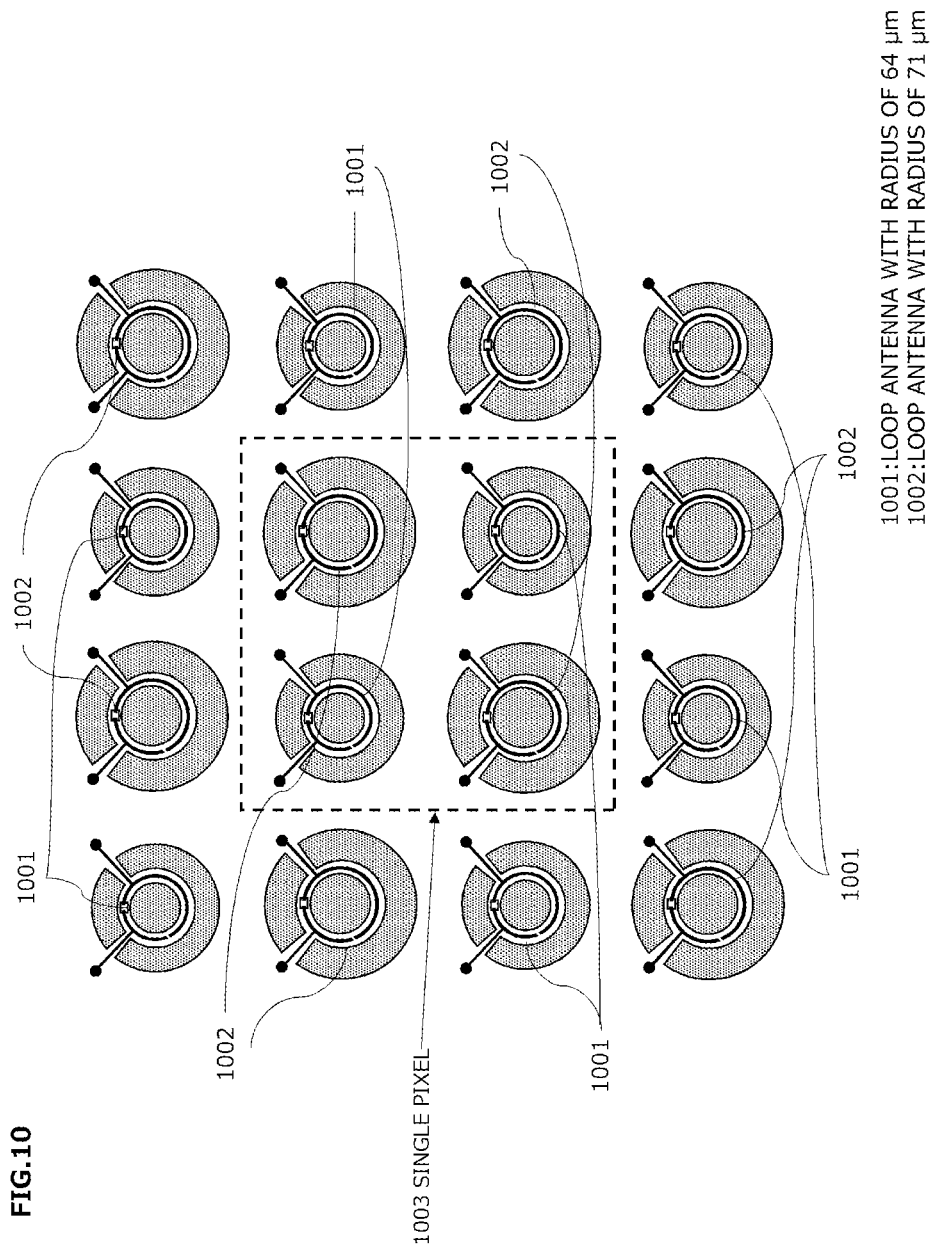
FIG. 10 is a diagram showing an array of loop antennas of a detector according to a first example.

Next, the rectifying element 12 and the loop antenna 11 made of a metal film are electrically connected to each other via a contact hole opened in the insulating film 101 that insulates the loop antenna 11 and the antenna substrate 10 from each other. As the insulating film, SiOx with a thickness of 2.6 μm grown by plasma CVD (Chemical Vapor Deposition) is used. The loop antenna 11 is formed by disposing the metal film on the insulating film and patterning the metal film by photolithography. In the present example, as shown in FIG. 10, a loop antenna 1001 with a radius of 64 μm and a loop antenna 1002 with a radius of 71 μm are periodically arranged, and aluminum is used as the metal film.

Next, the antenna substrate 10 is thinned to a thickness of 60 μm and joined to the drive circuit substrate 16 as shown in FIG. 1C. In order to thin the antenna substrate 10, a support substrate is joined by a temporary-fixing adhesive to the surface on which the loop antenna is formed, and an opposite-side surface is ground by a back grinding apparatus down to a thickness of 60 μm. Subsequently, the ground surface and the drive circuit substrate 16 are joined by the adhesive 17. In the present example, BCB (Benzocyclobutene (CYCLOTENE 3022-35 manufactured by The Dow Chemical Company)) is used as the adhesive 17. After the antenna substrate 10 and the drive circuit substrate 16 are joined to each other, the support substrate is removed to create the state shown in FIG. 1C. In the present example, a 500 μm-thick glass substrate is used as the support substrate and LC-5320 manufactured by 3M is used as the temporary-fixing adhesive. In this case, applying LTHC (Light-To-Heat Conversion) manufactured by 3M as a release layer to the glass substrate before applying LC-5320 enables the support substrate to be removed by laser irradiation.

In the present example, before joining the antenna substrate 10 and the drive circuit substrate 16 to each other, the reflective plate 19 made of metal is disposed on the ground surface of the antenna substrate 10. In the present example, aluminum is used as the metal, and the reflective plate 19 is formed by photolithography by patterning aluminum in a circular shape with a same radius as the substrate-removed region 18 to be formed in a step to be described later. In addition, the reflective plate 19 is disposed so as to be positioned directly under the substrate-removed region 18 and, although not illustrated, the reflective plate 19 is disposed via an insulating film so that the reflective plate 19 and the antenna substrate 10 do not come into electric contact with each other. In the present example, 100 nm-thick SiOx is used as the insulating film. It should be noted that the reflective plate 19 need not have a same planar shape as the substrate-removed rethon 18 and need not have a same radius as the substrate-removed region 18. The reflective plate 19 may have a bigger radius than the substrate-removed region 18. A form of the reflective plate 19 can be appropriately changed in accordance with sizes and shapes of the substrate-removed region 18 and the loop antenna 11.

Next, the lead-out line 14 connected to the loop antenna 11 and the drive circuit substrate 16 are electrically connected using the through electrode 15. The through electrode 15 according to the present example is formed by dry-etching the silicon of the antenna substrate 10 and the BCB of the adhesive 17, forming a through-hole to a wiring layer of the drive circuit substrate 16, and disposing copper inside the through-hole by electrolytic plating. In this case, the copper is disposed via TEOS (Tetraethoxysilane) that is an insulating film so that the antenna substrate 11 and the copper do not come into electric contact with each other.

Next, the antenna substrate 10 around the loop antenna 11 is removed by dry etching to provide the substrate-removed region 18. In the present example, the substrate-removed region 18 with a depth of 40 μm is formed by etching according to the Bosch process. In this case, etching is performed so that the loop antenna 11 is disposed on a remaining portion of the antenna substrate 10 having a width of 14 μm.

The drive circuit substrate 16 processes or outputs a signal that combines signals from a total of four loop antennas made up of two loop antennas 1101 with a radius of 64 μm and two loop antennas 1102 with a radius of 71 μm as shown in FIG. 10 as a pixel signal of a pixel 1103. In this case, the composite signal may be a summation signal or an average signal of the signals from the respective loop antennas.

Since the detector according to the present example fabricated as described above forms a single pixel using signals of two loop antennas with different resonant frequencies, even if a frequency of a light source varies, a detector which accommodates a frequency variation of the light source and which is capable of securing a high sensitivity can be produced. As indicated in the calculation result shown in FIG. 2, the loop antenna with a radius of 64 μm has a resonant frequency of 0.51 THz and the loop antenna with a radius of 71 μm has a resonant frequency of 0.48 THz. Therefore, the detector according to the present example is capable of detecting a terahertz wave with good sensitivity even when a spectrum of the light source is any frequency within a range of 0.48 to 0.51 THz or when the spectrum spreads within this range.

Second Example

In the present example, an example of the detector according to the present invention in which a single pixel is formed by loop antennas with different widths of the antenna substrate remaining portion will be described.

Figure 11:
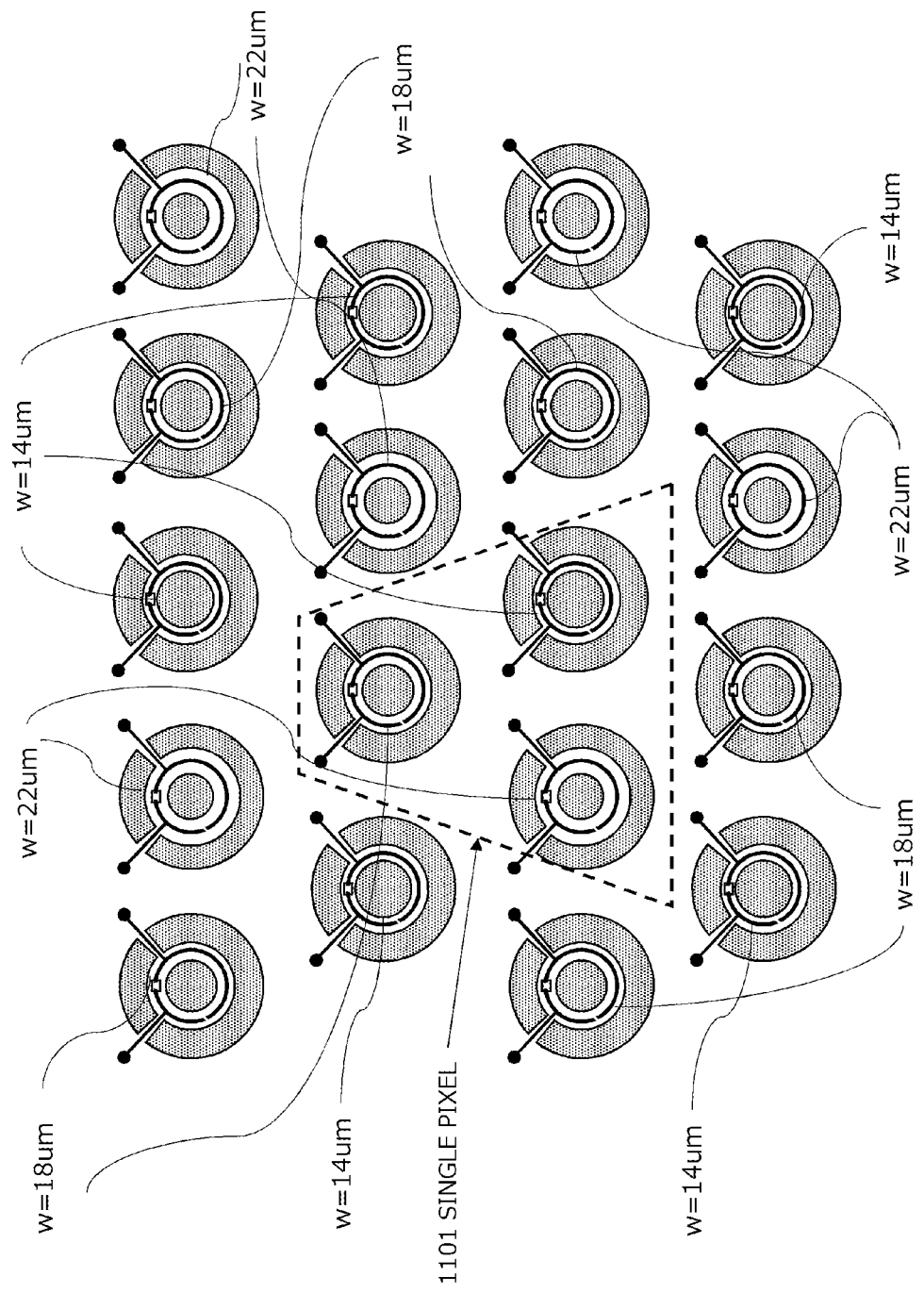
FIG. 11 is a diagram showing an array of loop antennas of a detector according to a second example.

A detector that joins the antenna substrate 10 and the drive circuit substrate 16 with each other is fabricated in a similar manner to the first example. In the present example, unlike in the first example, 64 μm is the only radius of the loop antenna, the antenna substrate remaining portion width 102(w) around the loop antenna shown in FIG. 1C has three values of 14 μm, 18 μm, and 22 μm, and the antenna substrate remaining portion widths 102(w) are arranged in a triangular grid as shown in FIG. 11. In addition, a thickness of the insulating film 101 between the antenna substrate 10 and the loop antenna 11 is set to 1.5 μm.

As shown in FIG. 12, the drive circuit substrate 16 is designed to process a summation value or an average value of signals from the three loop antennas of which the antenna substrate remaining portion widths are respectively 14 μm, 18 μm, and 22 μm as a single pixel 1101.

Since the detector according to the present example fabricated as described above forms a single pixel using signals of three loop antennas with different resonant frequencies, even if a frequency of a light source varies, a detector which accommodates a frequency variation of the light source and which is capable of securing a high sensitivity can be produced.

In other words, according to the calculation result shown in FIG. 9, the loop antenna of which the antenna substrate remaining portion width is 14 μm has a resonant frequency of 0.46 THz, the loop antenna of which the antenna substrate remaining portion width is 18 μm has a resonant frequency of 0.45 THz, and the loop antenna of which the antenna substrate remaining portion width is 22 μm has a resonant frequency of 0.43 THz. Therefore, a detector is provided which is capable of maintaining sensitivity even with respect to a light source of which a spectrum spreads within a range of 0.43 to 0.46 THz.

Miscellaneous

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-163049, filed on Sep. 29, 2020, which is hereby incorporated by reference herein in its entirety.

What is claimed is:

1. A detector configured to detect an electromagnetic wave, the detector comprising:
   a plurality of antennas each having a rectifying element, wherein the plurality of antennas includes at least a first antenna having a first resonant frequency and a second antenna having a second resonant frequency that differs from the first resonant frequency,
   wherein:
   a band of an electromagnetic wave that can be detected by the first antenna is a first band including the first resonant frequency,
   a band of an electromagnetic wave that can be detected by the second antenna is a second band including the second resonant frequency, and
   a part of the first band and a part of the second band overlap with each other, and
   wherein a sensitivity $S(f)=S_1(f)+S_2(f)$ obtained by adding up a sensitivity $S_1(f)$ of the first antenna and a sensitivity $S_2(f)$ of the second antenna with respect to a frequency f of an electromagnetic wave is equal to or higher than $3/4$ of a maximum sensitivity of $S(f)$ in a frequency band between the first resonant frequency and the second resonant frequency.

2. The detector according to claim 1, wherein the first antenna and the second antenna are loop antennas.

3. The detector according to claim 2, wherein the first antenna and the second antenna differ from each other in a radius of the loop antenna.

4. The detector according to claim 3, wherein the radii of the first antenna and the second antenna are at least 64 μm and not more than 80 μm.

5. The detector according to claim 2, wherein the first antenna and the second antenna differ from each other in a width of a substrate remaining portion arranged under a conductor that constitutes the loop antenna.

6. The detector according to claim 5, wherein the width of the substrate remaining portion of the first antenna and the second antenna is at least 10 μm and not more than 34 μm.

7. The detector according to claim 2,
wherein the first antenna has a first conductor constituting the loop antenna and a first insulating film disposed between the first conductor and a substrate, and the second antenna has a second conductor constituting the loop antenna and a second insulating film disposed between the second conductor and the substrate, and
wherein a thickness of the first insulating film is different from a thickness of the second insulating film.

8. The detector according to claim 7, wherein the thickness of the first insulating film is at least 1.5 μm and not more than 2.6 μm, and the thickness of the second insulating film is at least 1.5 μm and not more than 2.6 μm.

9. The detector according to claim 1, wherein the first antenna and the second antenna are periodically disposed.

10. The detector according to claim 1, wherein single pixel is constituted by an antenna set including the first antenna and the second antenna.

11. The detector according to claim 10, wherein a signal that combines signals obtained from the first antenna and the second antenna constituting the single pixel is output as a pixel signal.

12. The detector according to claim 1, wherein the first resonant frequency and the second resonant frequency are at least 0.03 THz and not more than 30 THz.

13. An image forming apparatus, comprising:
a light source that irradiates an electromagnetic wave;
the detector according to claim 1; and
a signal processing portion that generates an image from a signal detected by the detector.

14. A detector that detects an electromagnetic wave, the detector comprising:
a plurality of antennas each having a rectifying element, wherein:
the plurality of antennas includes at least a first antenna having a first resonant frequency and a second antenna having a second resonant frequency that differs from the first resonant frequency,
wherein the first antenna and the second antenna are loop antennas,
wherein the first antenna and the second antenna are constructed by disposing a conductor constituting the loop antenna on a substrate via an insulating film, and
wherein the first antenna and the second antenna differ from each other in a thickness of the insulating film.

15. The detector according to claim 14, wherein the thickness of the insulating film of the first antenna and the second antenna is at least 1.5 μm and not more than 2.6 μm.

* * * * *